United States Patent
Tang et al.

(10) Patent No.: US 9,711,596 B2
(45) Date of Patent: Jul. 18, 2017

(54) SEMICONDUCTOR DEVICE INCLUDING A SEMICONDUCTOR SHEET INTERCONNECTING A SOURCE REGION AND A DRAIN REGION

(71) Applicant: Taiwan Semiconductor Manufacturing Company Limited, Hsinchu (TW)

(72) Inventors: Hao-Ling Tang, Hsinchu County (TW); Jon-Hsu Ho, New Taipei (TW); Shao-Hwang Sia, Taipei (TW); Wen-Hsing Hsieh, Hsinchu (TW); Ching-Wei Tsai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/557,894

(22) Filed: Dec. 2, 2014

(65) Prior Publication Data
US 2015/0372083 A1    Dec. 24, 2015

Related U.S. Application Data

(63) Continuation-in-part of application No. 14/312,739, filed on Jun. 24, 2014, now Pat. No. 9,337,263.

(51) Int. Cl.
*H01L 29/06* (2006.01)
*H01L 29/10* (2006.01)
*H01L 45/00* (2006.01)
*H01L 21/8234* (2006.01)
(Continued)

(52) U.S. Cl.
CPC .... *H01L 29/0684* (2013.01); *H01L 21/30604* (2013.01); *H01L 21/823418* (2013.01);
(Continued)

(58) Field of Classification Search
CPC ..... H01L 21/823814; H01L 21/823885; H01L 21/823487; H01L 21/8234;
(Continued)

(56) References Cited

U.S. PATENT DOCUMENTS

2005/0062082 A1*  3/2005  Bucher ................... H01L 29/26
                                                                       257/288
2011/0012085 A1*  1/2011  Deligianni ............. B82Y 10/00
                                                                       257/9
(Continued)

OTHER PUBLICATIONS

Korean Office Action; Application No. 10-2014-0149598; dated Apr. 27, 2016.
(Continued)

*Primary Examiner* — Benjamin Sandvik
*Assistant Examiner* — Changhyun Yi
(74) *Attorney, Agent, or Firm* — Jones Day

(57) ABSTRACT

A semiconductor device includes a substrate, a first source/drain (S/D) region, a second S/D region, and a semiconductor sheet. The first S/D region is disposed on the substrate. The second S/D region is disposed above the first S/D region. The semiconductor sheet interconnects the first and second S/D regions and includes a plurality of turns. A method for fabricating the semiconductor device is also disclosed.

20 Claims, 9 Drawing Sheets

(51) Int. Cl.
  *H01L 29/66* (2006.01)
  *H01L 29/78* (2006.01)
  *H01L 29/08* (2006.01)
  *H01L 27/088* (2006.01)
  *H01L 29/45* (2006.01)
  *H01L 21/306* (2006.01)
  *H01L 29/423* (2006.01)

(52) U.S. Cl.
  CPC .... *H01L 21/823487* (2013.01); *H01L 27/088* (2013.01); *H01L 29/0847* (2013.01); *H01L 29/42356* (2013.01); *H01L 29/456* (2013.01); *H01L 29/66666* (2013.01); *H01L 29/7827* (2013.01); *H01L 21/823475* (2013.01)

(58) Field of Classification Search
  CPC ............... H01L 21/82348; H01L 29/06; H01L 29/0665; H01L 29/7827; H01L 29/0684; H01L 29/66666; H01L 29/42356; H01L 29/0847; H01L 29/0676; H01L 27/088; H01L 2924/13061; Y10S 977/938
  See application file for complete search history.

(56) References Cited

U.S. PATENT DOCUMENTS

| | | | | |
|---|---|---|---|---|
| 2011/0242731 A1* | 10/2011 | Fleischer | ............... | H01G 11/36 361/502 |
| 2013/0214810 A1* | 8/2013 | Huang | .................... | H01L 22/34 324/762.01 |
| 2013/0270508 A1 | 10/2013 | Li et al. | | |
| 2013/0328136 A1* | 12/2013 | Booth, Jr. | ......... | H01L 21/28282 257/410 |
| 2013/0341704 A1* | 12/2013 | Rachmady | ........ | H01L 29/66545 257/327 |
| 2014/0017839 A1* | 1/2014 | Li | ....................... | H01L 31/0352 438/36 |
| 2014/0332814 A1* | 11/2014 | Peng | .................... | H01L 21/0262 257/49 |
| 2014/0367771 A1* | 12/2014 | Chatty | ................ | H01L 29/0623 257/329 |
| 2015/0123215 A1* | 5/2015 | Obradovic | ........ | H01L 29/42392 257/410 |
| 2015/0200202 A1* | 7/2015 | Karda | ............... | H01L 27/11582 438/268 |
| 2015/0294875 A1* | 10/2015 | Khondaker | ....... | H01L 21/02175 257/411 |
| 2016/0020305 A1* | 1/2016 | Obradovic | .......... | H01L 29/7391 257/39 |

OTHER PUBLICATIONS

Taiwan Office Action; Application No. 104108584; dated May 20, 2016.

Korean Notice of Allowance; Application No. 10-2015-0031740; dated Oct. 14, 2016.

* cited by examiner

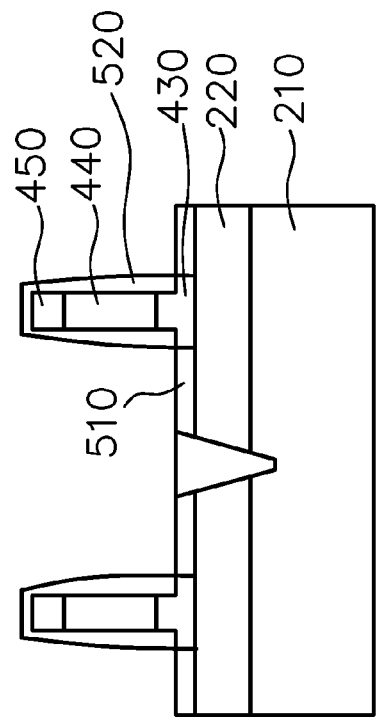
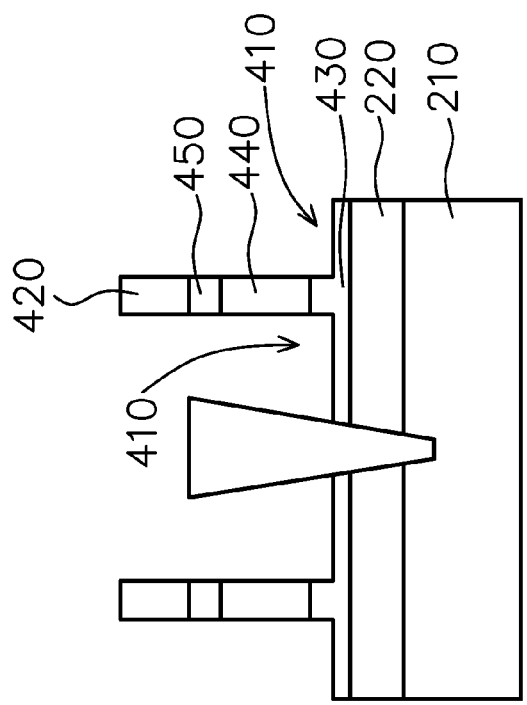

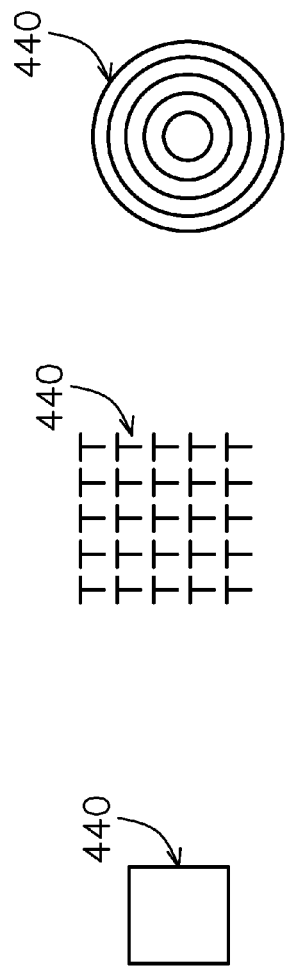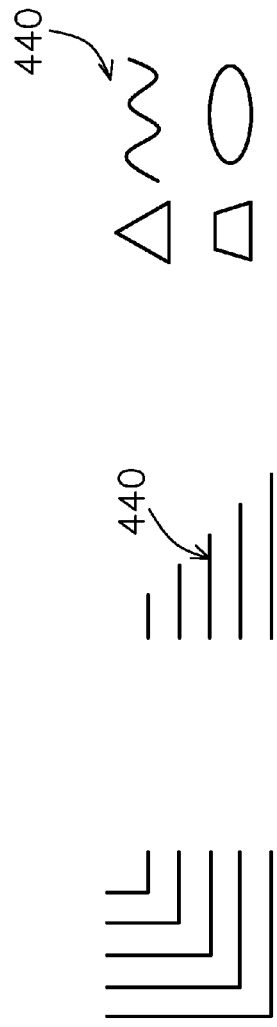

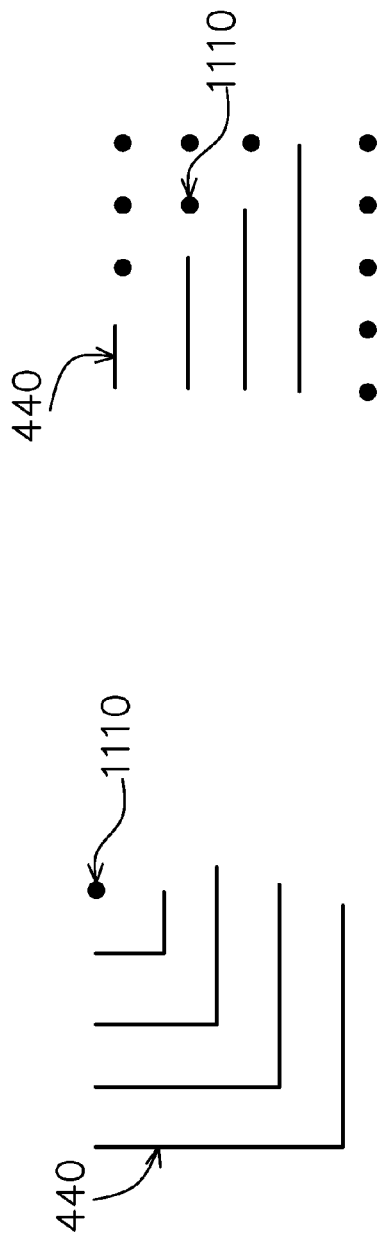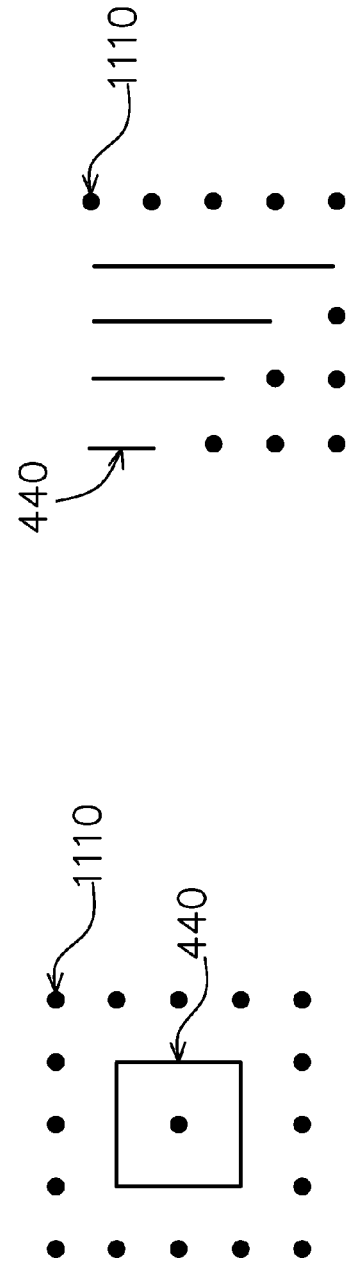

SEMICONDUCTOR DEVICE INCLUDING A SEMICONDUCTOR SHEET INTERCONNECTING A SOURCE REGION AND A DRAIN REGION

CROSS-REFERENCE TO A RELATED APPLICATION

This application is a continuation-in-part of U.S. patent application Ser. No. 14/312,739, entitled "SEMICONDUCTOR DEVICE INCLUDING A SEMICONDUCTOR SHEET UNIT INTERCONNECTING A SOURCE AND A DRAIN," filed Jun. 24, 2014, which is incorporated herein by reference in its entirety.

BACKGROUND

The present disclosure relates to a semiconductor device, more particularly to a semiconductor device that includes a semiconductor sheet interconnecting a source region and a drain region.

A conventional vertical gate all around (VGAA) metal-oxide-semiconductor field-effect transistor (MOSFET) is a semiconductor device that includes a source region, a drain region, and a nanowire. The nanowire extends in a vertical direction, interconnects, and thus serves as a channel between, the source region and the drain region, and has a cross-sectional shape of a dot. Modification of such channel can improve the performance of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-8 are schematic sectional views illustrating various stages in the fabrication of an exemplary semiconductor device in accordance with some embodiments.

FIGS. 10A-10F are schematic top views illustrating cross-sectional shapes of a semiconductor sheet unit of the semiconductor device in accordance with some embodiments.

FIGS. 11A-11D are schematic top views illustrating cross-sectional shapes of a semiconductor sheet unit and a nanowire unit of the semiconductor device in accordance with some embodiments.

DETAILED DESCRIPTION

Figure 1:
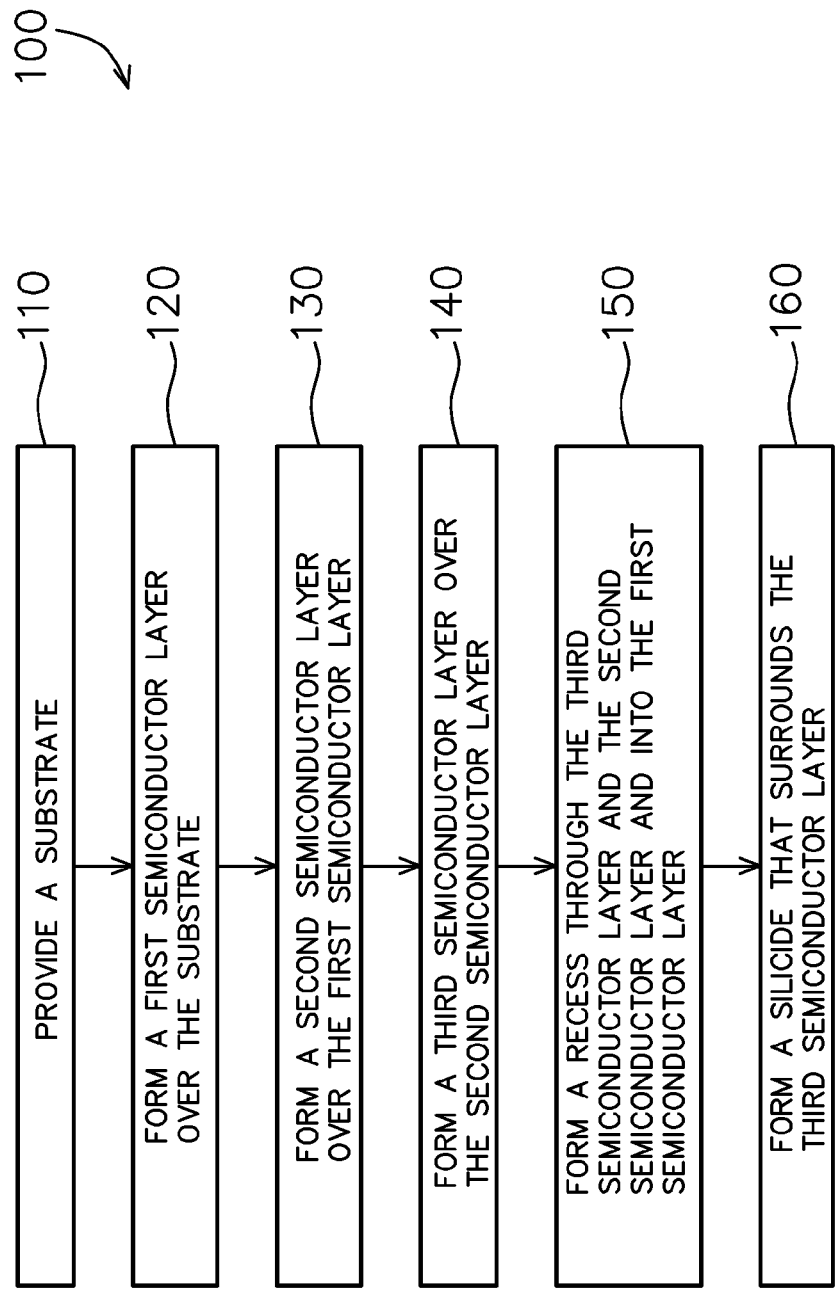
FIG. 1 is a flowchart of an exemplary method of fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor device that includes a source region, a drain region, a semiconductor sheet, a source contact, and a drain contact. The semiconductor sheet interconnects the source and drain regions and serves as a channel therebetween. The source and drain contacts are respectively and electrically coupled to the source and drain regions.

Analysis shows that when a length of the semiconductor sheet is increased, a source-drain current of the semiconductor device is increased. This is validated by simulation and measurement. As will be described herein, the semiconductor sheet of the semiconductor device of the present disclosure has a length maximized for a given area.

Further, analysis shows that when a resistance between the source/drain region and the source/drain contact is decreased, the source-drain current of the semiconductor device is further increased. This is also validated by simulation and measurement. As will be described herein, a resistance between the source/drain region and the source/drain contact of the semiconductor device of the present disclosure is decreased to a minimum.

Figure 3:
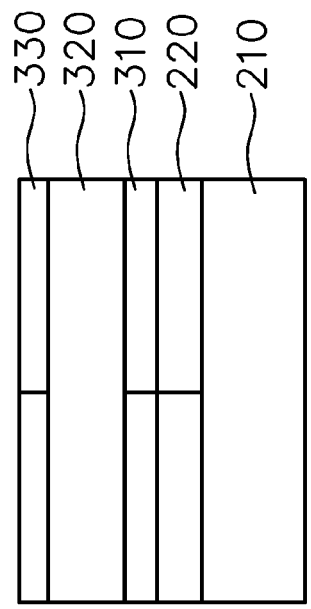
Figure 2:
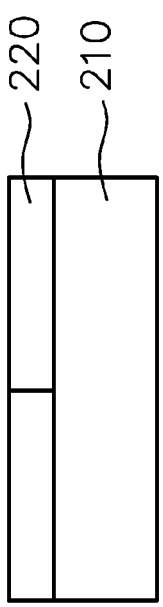
Figure 7:
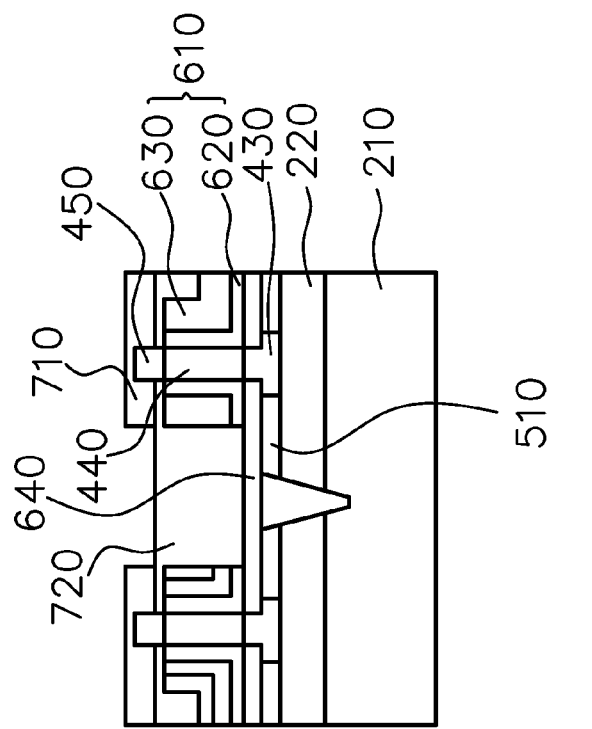

FIG. 1 is a flowchart of an exemplary method 100 of fabricating a semiconductor device in accordance with some embodiments. The method 100 begins with block 110 in which a substrate, e.g., substrate 210 shown in FIG. 2, is provided. The method 100 continues with block 120 in which a first semiconductor layer, e.g., first epitaxially grown layer 310 shown in FIG. 3, is formed over the substrate. The method 100 continues with block 130 in which a second semiconductor layer, e.g., second epitaxially grown layer 320 shown in FIG. 3, is formed over the first semiconductor layer. The method 100 continues with block 140 in which a third semiconductor layer, e.g., third semiconductor layer 330 shown in FIG. 3, is formed over the second semiconductor layer. The method 100 continues with block 150 in which a recess, e.g., recess 410 shown in FIG. 4, is formed that extends through the second and third semiconductor layers and into the first semiconductor layer. The method 100 continues with block 160 in which a silicide, e.g., second S/D silicide 710 shown in FIG. 7, is formed that surrounds the third semiconductor layer following the formation of the recess.

FIG. 2 is a schematic sectional view of a stage in the fabrication of an exemplary semiconductor device in accordance with some embodiments. FIG. 2 illustrates a structure after a substrate 210 is provided, and a well region 220 is formed in the substrate 210. In one exemplary embodiment, the substrate 210 includes Si, Ge, GaAs, SiC, InAs, InP, another suitable elementary semiconductor material or alloy of semiconductor materials, or a combination thereof. The formation of a well region 220 in the substrate 210 includes the following operations: depositing a protective layer over the substrate 210; patterning and etching the protective layer to expose a portion of the substrate 210; forming the well region 220 in the exposed portion of the substrate 210, such as by an implantation process or a diffusion process; and removing, such as by an etching process, the protective layer following the formation of the well region 220.

FIG. 3 is a schematic sectional view of another stage in the fabrication of an exemplary semiconductor device in accordance with some embodiments. FIG. 3 illustrates the structure of FIG. 2 after a first epitaxially grown layer 310, a second epitaxially grown layer 320, and a third epitaxailly grown layer 330 are formed in succession over the well region 220. In one exemplary embodiment, at least one of the epitaxially grown layers 310, 320, 330 includes Si, Ge, another suitable semiconductor material, or a combination thereof. The formation of epitaxially grown layers 310, 320, 330 includes the following operations: growing the first epitaxially grown layer 310 on the well region 220 using a first epitaxial growth process; growing the second epitaxially grown layer 320 on the first epitaxially grown layer 310 using a second epitaxial growth process; and growing the third epitaxially grown layer 330 on the second epitaxially grown layer 320 using a third epitaxial growth process. In an exemplary embodiment, at least one of the epitaxial growth processes is a chemical vapor deposition (CVD) process, a derivative thereof, another suitable deposition process, or a combination thereof. In such an exemplary embodiment, the at least one of the epitaxial growth processes uses $SiH_4$, another suitable gaseous precursor material, or a combination thereof.

In some exemplary embodiments, the well region 220 is a p-type well region. In such some exemplary embodiments, the epitaxially grown layers 310, 320, 330 are doped with an n-type dopant, and the first and third epitaxially grown layers 310, 330 are doped with a higher concentration of the n-type dopant than the second epitaxially grown layer 320. In other exemplary embodiments, the well region 220 is an n-type well region. In such other exemplary embodiments, the epitaxially grown layers 310, 320, 330 are doped with a p-type dopant, and the first and third epitaxially grown layers 310, 330 are doped with a higher concentration of the p-type dopant than the second epitaxially grown layer 320.

FIG. 4 is a schematic sectional view of another stage in the fabrication of an exemplary semiconductor device in accordance with some embodiments. FIG. 4 illustrates the structure of FIG. 3 after a recess 410 is formed that extends through the second and third epitaxially grown layers 320, 330 and into the first epitaxially grown layer 310. The formation of a recess 410 that extends through the second and third epitaxially grown layers 320, 330 and into the first epitaxially grown layer 310 includes the following operations: forming a hard mask 420 over the third epitaxially grown layer 330; patterning and etching the hard mask 420; following the patterning and etching of the hard mask 420, using the hard mask 420 as an etching mask, etching the epitaxially grown layers 310, 320, 330. In an exemplary embodiment, the hard mask 420, such as a SiN hard mask or the like, is formed using a CVD process, a derivative thereof, another deposition process, or a combination thereof.

The first, second, and third epitaxially grown layers 310, 320, 330 surrounded by the recess 410 form a portion of a first source/drain (S/D) region 430, a semiconductor sheet 440, and a second S/D region 450, respectively.

As illustrated in FIG. 4, the first S/D region 430 has a generally inverted-T cross-sectional shape along a substantially vertical plane, and includes a first end portion that is disposed on the well region 220, and a second end portion that extends from the first end portion. The second S/D region 450 is disposed above the first S/D region 430 in a substantially vertical direction. In an exemplary embodiment, the first S/D region 430 serves as a source region, and in such an exemplary embodiment, the second S/D region 450 serves as a drain region. In another exemplary embodiment, the first S/D region 430 serves as a drain region, and in such another exemplary embodiment, the second S/D region 450 serves as a source region.

Figure 9B:
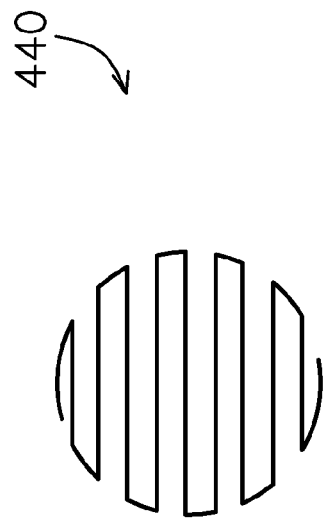
FIGS. 9A-9D are schematic top views illustrating cross-sectional shapes of a semiconductor sheet of the semiconductor device in accordance with some embodiments.
Figure 9D:
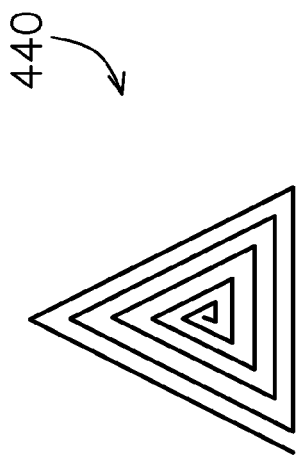
Figure 9A:
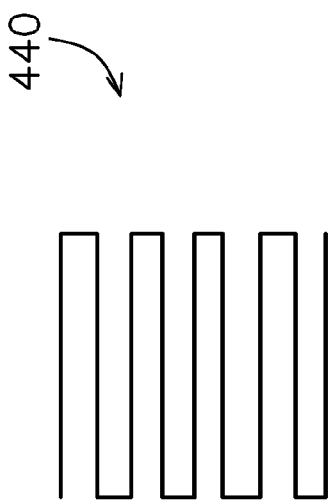

The semiconductor sheet 440 interconnects the first and second S/D regions 430, 450, serves as a channel therebetween, and includes a plurality of turns. In an exemplary embodiment, the semiconductor sheet 440 has a meandering cross-sectional shape along a substantially horizontal plane. Moreover, in an exemplary embodiment, the meandering cross-sectional shape is generally polygonal, e.g., rectangular, as best shown in FIG. 9A, or generally circular, as best shown in FIG. 9B. Further, in an exemplary embodiment, the turns of the semiconductor sheet 440 are substantially parallel to each other and have a substantially same pitch, i.e., distance between the turns.

Figure 9C:
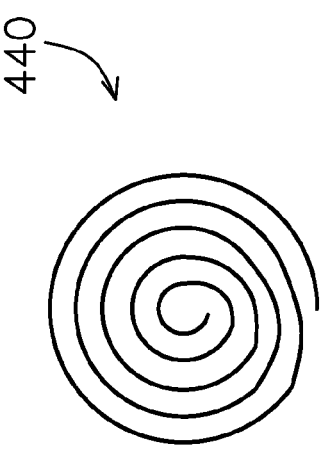

In an alternative exemplary embodiment, the semiconductor sheet 440 has a spiral cross-sectional shape along the horizontal plane. Moreover, in an alternative exemplary embodiment, the spiral cross-sectional shape is generally circular, as best shown in FIG. 9C, or generally polygonal, e.g., triangular, as best shown in FIG. 9D. Further, in an alternative exemplary embodiment, the turns of the semiconductor sheet 440 are substantially parallel to each other and have a substantially same pitch.

In some exemplary embodiments, the semiconductor sheet 440 has a generally straight line cross-sectional shape along the horizontal plane. In other exemplary embodiments, the semiconductor sheet 440 has a cross-sectional shape along the horizontal plane other than a straight line. Such cross-sectional shapes include, for example, a U-shaped cross section, an L-shaped cross section, an annular, a sinusoidal, and the like.

In one exemplary embodiment, the semiconductor device includes a plurality of the semiconductor sheets 440. In such one exemplary embodiment, the semiconductor sheets 440 cooperatively define a single cross-sectional shape along the horizontal plane of, for example, a square, as best shown in FIG. 10A, or a plurality of cross sections along the horizontal plane that have the same shape and size, such as those shown in FIG. 10B, that have the same shape but different sizes, such as those shown in FIGS. 10C-10E, and that have different shapes, such as those shown in FIG. 10F. Moreover, in one exemplary embodiment, the method 100 further includes the operations of: forming at least one source region, at least one drain region, and at least one nanowire that extends in the vertical direction, that interconnects the at least one source region and the at least one drain region, that serves as a channel therebetween, and that has a cross-sectional shape along the horizontal plane of a dot. Further, in one exemplary embodiment, the semiconductor sheets 440 and the at least one nanowire 1110 cooperatively define cross-sectional shapes along the horizontal plane, such as those shown in FIGS. 11A-11D.

FIG. 5 is a schematic sectional view of another stage in the fabrication of an exemplary semiconductor device in accordance with some embodiments. FIG. 5 illustrates the structure of FIG. 4 after a first S/D silicide 510 is formed that surrounds the first end portion of the first S/D region 430. The formation of a first S/D silicide 510 that surrounds the first end portion of the first S/D region 430 includes the following operations: removing, by an etching process, the hard mask 420 from the structure of FIG. 4; forming a spacer 520 on sidewalls of the second end portion of the first S/D region 430, the semiconductor sheet 440, and the second S/D region 450, and a top surface of the second S/D region 450; forming a silicide metal over the first end portion of the first S/D region 430 following the formation of the spacer 520; subjecting a structure following the formation of the silicide metal to an annealing process to thereby react the silicide metal, whereby the reacted silicide metal forms the first S/D silicide 510; and removing the unreacted metal.

In an exemplary embodiment, the spacer 520 has a thickness 30% less than the pitch of the turns of the semiconductor sheet 440. Examples of materials for the spacer 520 include, but are not limited to, SiN, SiO2, SiON, and the like. Moreover, in an exemplary embodiment, the silicide metal is formed using an electroplating process, an electroless plating process, an immersion plating process, a light assisted plating process, another deposition process, or a combination thereof. Examples of materials for the silicide metal include, but are not limited to, Ti, Ni, Co, and the like. Further, in an exemplary embodiment, the annealing process includes a rapid thermal annealing (RTA), a laser thermal annealing, another suitable annealing, or a combination thereof.

Figure 6:
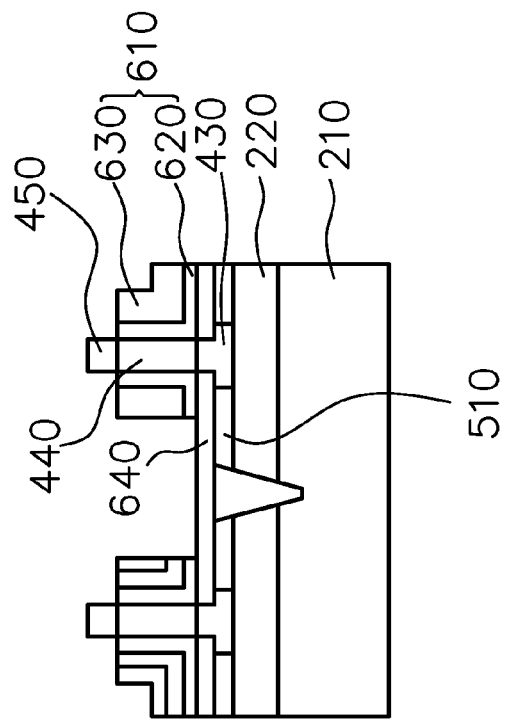

FIG. 6 is a schematic sectional view of another stage in the fabrication of an exemplary semiconductor device in accordance with some embodiments. FIG. 6 illustrates the structure of FIG. 5 after a gate stack 610 is formed that surrounds the semiconductor sheet 440. In this exemplary embodiment, the gate stack 610 includes a conductive layer 630, and a high-k dielectric layer 620 sandwiched between the semiconductor sheet 440 and the conductive layer 630. In an alternative exemplary embodiment, the gate stack 610 further includes an interfacial dielectric layer sandwiched between the semiconductor sheet 440 and the high-k dielectric layer 620, and another conductive layer sandwiched between the high-k dielectric layer 620 and the conductive layer 630.

In one exemplary embodiment, the formation of a gate stack 610 that surrounds the semiconductor sheets 440 includes the following operations: removing, such as by an etching process, the spacer 520 from the structure of FIG. 5; conformably forming another spacer 640 over a structure following the removal of the spacer 520; etching the spacer 640 to make the spacer 640 substantially level with the second end portion of the first S/D region 430; conformably forming the high-k dielectric layer 620 over a structure following the etching of the spacer 640; conformably forming the conductive layer 630 over the high-k dielectric layer 620; and cutting the high-k dielectric layer 620 and the conductive layer 630 to form the gate stack 610.

Examples of materials for the spacer 640 include, but are not limited to, $SiO_2$, SiCN, SiN, and SiOCN. Examples of materials for the high-k dielectric layer 620 include but are not limited to, $HfO_2$, $Al_2O_3$, $La_2O_3$, another metal oxide, and a combination thereof. Examples of materials for the conductive layer 630 include, but are not limited to, Ti, Ta, Al, W, TiN, TaN, TiAl, and the like.

FIG. 7 is a schematic sectional view of another stage in the fabrication of an exemplary semiconductor device in accordance with some embodiments. FIG. 7 illustrates the structure of FIG. 6 after a second S/D silicide 710 is formed that surrounds the second S/D region 450. The formation of a second S/D silicide 710 that surrounds the second S/D region 450 includes the following operations: forming an interlayer dielectric (ILD) layer 720 over the structure of FIG. 6; planarizing, such as by chemical-mechanical polishing/planarization (CMP), the ILD layer 720 until the ILD layer 720 is above a junction between the semiconductor sheet 440 and the second S/D region 450 and below a top surface of the second S/D region 450; forming a silicide metal over the ILD layer 720 and the second S/D region 450; subjecting a structure following the formation of the silicide metal to an annealing process to thereby react the silicide metal, whereby the reacted silicide metal forms the second S/D silicide 710; and removing the unreacted silicide metal.

Figure 8:
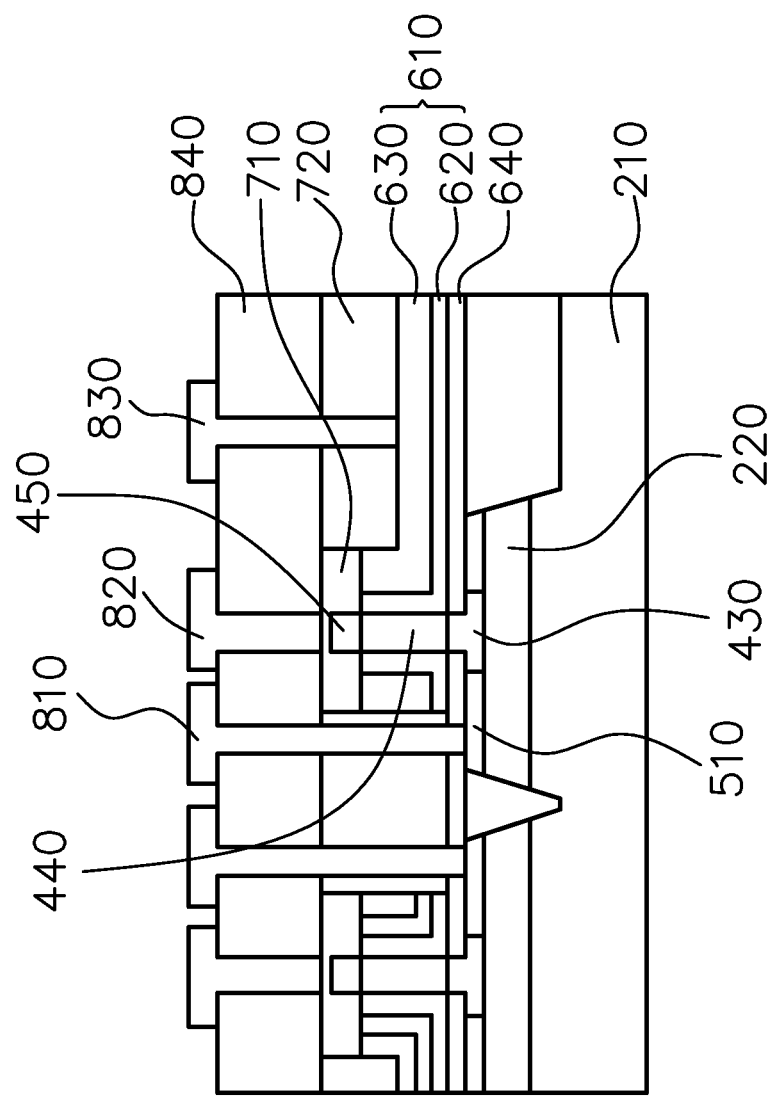

FIG. 8 is a schematic sectional view of another stage in the fabrication of an exemplary semiconductor device in accordance with some embodiments. FIG. 8 illustrates the structure of FIG. 7 after a first S/D contact 810, a second S/D contact 820, and a gate contact 830 are formed, each of which is electrically connected to a respective one of the first and second S/D silicides 510, 710 and the conductive layer 630 of the gate stack 610. In one exemplary embodiment, the first and second S/D contacts 810, 820 and the gate contact 830 are formed using a middle-end-of-lines (MEOL) process, in which another ILD layer 840 is first formed over the structure of FIG. 7. The spacer 640 and the ILD layers 720, 840 constitute an insulation. Then, the insulation is patterned and etched to form contact openings, each of which extends through the insulation and connects onto a respective one of the first and second S/D silicides 510, 710 and the conductive layer 630 of the gate stack 610. Next, a conductive layer is formed over the insulation and in the contact openings. Thereafter, the conductive layer is patterned and etched to form the first and second S/D contacts 810, 820 and the gate contact 830.

As illustrated in FIG. 8, the semiconductor device includes a substrate 210, a first S/D region 430, a second S/D region 450, and a semiconductor sheet 440.

In this exemplary embodiment, the substrate 210 is a bulk silicon substrate. In an alternative exemplary embodiment, the substrate 210 is a semiconductor-on-insulator (SOI) substrate, and includes a monocrystalline silicon base, a monocrystalline silicon layer, and an oxide layer sandwiched therebetween. The semiconductor device further includes a well region 220 disposed in the substrate 210.

The first S/D region 430 has a generally inverted-T cross-sectional shape along a substantially vertical plane, and includes a first end portion that is disposed on the well region 220, and a second end portion that extends from the first end portion. In an exemplary embodiment, a horizontal distance between edges of the first and second end portions of the first S/D region 430 is 30% less than the pitch of the turns of the semiconductor sheet 440.

The second S/D region 450 is disposed above the first S/D region 430 in a substantially vertical direction. In this exemplary embodiment, the first S/D region 430 serves as a source region, and the second S/D region 450 serves as a drain region. In an alternative exemplary embodiment, the first S/D region 430 serves as a drain region, and the second S/D region 450 serves as a source region.

The semiconductor sheet 440 interconnects the first and second S/D regions 430, 450, serves as a channel therebetween, and includes a plurality of turns. In an exemplary embodiment, the semiconductor sheet 440 has a meandering cross-sectional shape along a substantially horizontal plane. Moreover, in an exemplary embodiment, the meandering cross-sectional shape is generally polygonal, e.g., rectangular, as best shown in FIG. 9A, or generally circular, as best shown in FIG. 9B. Further, in an exemplary embodiment, the turns of the semiconductor sheet 440 are substantially parallel to each other and have a substantially same pitch.

In an alternative exemplary embodiment, the semiconductor sheet 440 has a spiral cross-sectional shape along the horizontal plane. Moreover, in an alternative exemplary embodiment, the spiral cross-sectional shape is generally circular, as best shown in FIG. 9C, or generally polygonal, e.g., triangular, as best shown in FIG. 9D. Further, in an alternative exemplary embodiment, the turns of the semiconductor sheet 440 are substantially parallel to each other and have a substantially same pitch.

In some exemplary embodiments, the semiconductor sheet 440 has a generally straight line cross-sectional shape along the horizontal plane. In other exemplary embodiments, the semiconductor sheet 440 has a cross-sectional shape along the horizontal plane other than a straight line, such as a U-shaped cross section, an L-shaped cross section, an annular, a sinusoidal, and the like.

In one exemplary embodiment, the semiconductor device includes a plurality of the semiconductor sheets 440. In such one exemplary embodiment, the semiconductor sheets 440 cooperatively define a single cross-sectional shape along the horizontal plane of, for example, a square, as best shown in FIG. 10A, or a plurality of cross sections along the horizontal plane that have the same shape and size, such as those shown in FIG. 10B, that have the same shape but different sizes, such as those shown in FIGS. 10C-10E, and that have different shapes, such as those shown in FIG. 10F. Moreover, in one exemplary embodiment, the semiconductor device further includes at least one source region, at least one drain region, and at least one nanowire that extends in the vertical direction, that interconnects the at least one source region and the at least one drain region, and that has a cross-sectional shape along the horizontal plane of a dot. Further, in one exemplary embodiment, the semiconductor sheets 440 and the at least one nanowire 1110 cooperatively define cross-sectional shapes along the horizontal plane, such as those shown in FIGS. 11A-11D.

In some exemplary embodiments, the well region 220 is a p-type well region, the first and second S/D regions 430, 450 and the semiconductor sheet 440 are doped with an n-type dopant, and the first and second S/D regions 430, 450 are doped with a higher concentration of the n-type dopant than the semiconductor sheet 440.

In other exemplary embodiments, the well region 220 is an n-type well region, the first and second S/D regions 430, 450 and the semiconductor sheet 440 are doped with a p-type dopant, and the first and second S/D regions 430, 450 are doped with a higher concentration of the p-type dopant than the semiconductor sheet 440.

The semiconductor device further includes a first S/D silicide 510, a spacer 640, a gate stack 610, a second S/D silicide 710, a first ILD layer 720, a second ILD layer 840, a first S/D contact 810, a second S/D contact 820, and a gate contact 830.

The first S/D silicide 510 surrounds the first end portion of the first S/D region 430. In this exemplary embodiment, the first end portion of the first S/D region 430 and the first S/D silicide 510 have a substantially same thickness.

The spacer 640 surrounds the second end portion of the first S/D region 430. In this exemplary embodiment, the second end portion of the first S/D region 430 and the spacer 640 have a substantially same thickness.

The gate stack 610 surrounds the semiconductor sheet 440. In this exemplary embodiment, the gate stack 610 includes a conductive layer 630, and a high-k dielectric layer 620 sandwiched between the semiconductor sheet 440 and the conductive layer 630. In an alternative exemplary embodiment, the gate stack 610 further includes an interfacial dielectric layer sandwiched between the semiconductor sheet 440 and the high-k dielectric layer 620, and another conductive layer sandwiched between the high-k dielectric layer 620 and the conductive layer 630.

The second S/D silicide 710 surrounds the second S/D region 450. In this exemplary embodiment, the second S/D silicide 710 is formed on a sidewall and a top surface of the second S/D region 450.

The first ILD layer 720 surrounds the gate stack 610 and the second S/D silicide 710. In this exemplary embodiment, the first ILD layer 720 has a top surface substantially flush with a top surface of the second S/D silicide 710. The second ILD layer 840 is disposed on the first ILD layer 720. Examples of materials for the first and second ILD layers 720, 840 include, but are not limited to, SiO2, SiCN, SiN, and SiOCN.

The first S/D contact 810 extends through the first and second ILD layers 720, 840 and the spacer 640 and is electrically connected to the first S/D silicide 510. Since the first S/D silicide 510 surrounds the first end portion of the first S/D region 430, a contact area between first S/D contact 810 and the first S/D region 430 is enlarged, whereby a resistance between the first S/D contact 810 and the first S/D region 430 is decreased to a minimum.

The second S/D contact 820 extends through the second ILD layer 840 and is electrically connected to the second S/D silicide 710. Since the second S/D silicide 710 surrounds the second S/D region 450, a contact area between the second S/D contact 820 and the second S/D region 450 is enlarged, whereby a resistance between the second S/D contact 820 and the second S/D region 450 is decreased to a minimum.

The gate contact 830 extends through the first and second ILD layers 720, 840 and is electrically connected to the conductive layer 630 of the gate stack 610.

It is noted that, since the first and second S/D regions 430, 450 are spaced apart to each other in the vertical direction, and since the gate stack 610 surrounds the semiconductor sheet 440, the semiconductor device may be referred to as a vertical gate-all-around (VGAA) metal-oxide-semiconductor field-effect transistor (MOSFET).

It is also noted that, ideally, when a length of a semiconductor sheet of a VGAA MOSFET is increased and thus a circumference thereof is increased, the amount of times of increase in the circumference of the semiconductor sheet of the VGAA MOSFET is substantially equal to the amount of times of increase in a source-drain current of the VGAA MOSFET.

Figure 12:
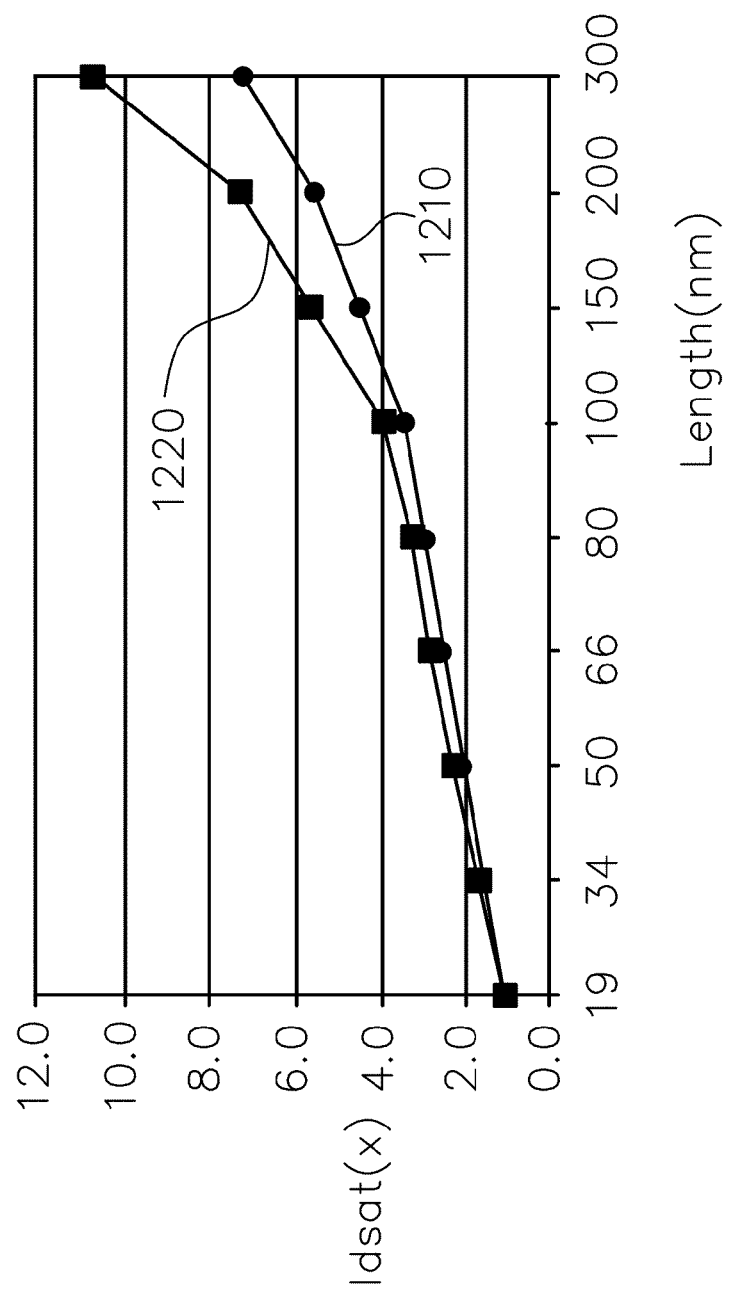
FIG. 12 is a plot illustrating source-drain current gains vs. lengths of exemplary semiconductor devices in accordance with some embodiments.

FIG. 12 is a plot illustrating source-drain current gains vs. lengths of exemplary first and second VGAA MOSFETs in accordance with some embodiments. The first VGAA MOSFET includes source and drain regions, a source contact that is electrically connected to the source region through a source silicide, a drain contact that is electrically connected to the drain region through a drain silicide, and a semiconductor sheet that interconnects the source and drain regions. The source/drain silicide of the first VGAA MOSFET does not surround the source/drain region of the first VGAA MOSFET. The second VGAA MOSFET includes source and drain regions, a source contact that is electrically connected to the source region through a source silicide, a drain contact that is electrically connected to the drain region through a drain silicide, and a semiconductor sheet that interconnects the source and drain regions. The source/drain silicide of the second VGAA MOSFET surrounds the source/drain region of the second VGAA MOSFET.

Based from experimental results, as illustrated in FIG. 12, when a length of the semiconductor sheet of the first VGAA MOSFET is increased from 19 nm to 300 nm, a source-drain current gain Idsat(x), as indicated by line 1210, of the first VGAA MOSFET is increased from unity to 7.2 times. Further, when a length of the semiconductor sheet of the second VGAA MOSFET is increased from 19 nm to 300 nm, a source-drain current gain Idsat(x), as indicated by line 1220, of the second VGAA MOSFET is increased from unity to 10.8 times, which is 49.5% higher than that of the first VGAA MOSFET.

It has thus been shown that the semiconductor device of the present disclosure includes a source region, a drain region, a semiconductor sheet that interconnects the source and drain regions and that includes a plurality of turns, a source silicide that surrounds the source region, a source contact that is electrically connected to the source silicide, a drain silicide that surrounds the drain region, a drain contact that is electrically connected to the drain silicide, a gate stack that surrounds the semiconductor sheet, and a gate contact that is electrically connected to the gate stack. As is readily appreciated by those skilled in the art after reading this disclosure, since the length of semiconductor sheet of the semiconductor device of the present disclosure is maximized for a given area and since the resistance between the source/drain region and the source/drain contact is decreased to a minimum, the semiconductor device of the present disclosure provides better heat dissipation and generates a higher drain-to-source/source-to-drain current, for a given set of operating conditions, without increasing the size thereof.

In addition, since current is highly dependent on a channel through which it passes, and since the semiconductor sheet(s) of the present disclosure, which serves as a channel between a source region and a drain region, can be configured in a variety of different cross-sectional shapes, the semiconductor device of the present disclosure can be configured with different source-to-drain current or drain-to-source current levels.

In an exemplary embodiment of a semiconductor device, the semiconductor device comprises: a substrate; a first source/drain (S/D) region that is disposed on the substrate; a second S/D region that is disposed above the first S/D region; and a semiconductor sheet that interconnects the first and second S/D regions and that includes a plurality of turns.

In another exemplary embodiment of a semiconductor device, the semiconductor device comprises: a substrate; a first source/drain (S/D) region that is disposed on the substrate; a second S/D region that is disposed above the first S/D region; a semiconductor sheet that interconnects the first and second S/D regions; and a silicide surrounding the second S/D region.

In an exemplary embodiment of a method of fabricating a semiconductor device, the method comprises: providing a substrate; forming a first semiconductor layer over the substrate; forming a second semiconductor layer over the first semiconductor layer; forming a third semiconductor layer over the second semiconductor layer, forming a recess that extends through the second and third semiconductor layers and into the first semiconductor layer; and forming a silicide that surrounds the third semiconductor layer following the formation of the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first source/drain (S/D) region;
   a second S/D region disposed above the first S/D region; and
   a semiconductor sheet interconnecting the first and second S/D regions, serving as a channel, and including a plurality of turns substantially confined to an interconnecting region between the first S/D region and the second S/D region.

2. The semiconductor device of claim 1, wherein the semiconductor sheet has a meandering cross-sectional shape along a substantially horizontal plane.

3. The semiconductor device of claim 2, wherein the meandering cross-sectional shape is generally one of circular and polygonal.

4. The semiconductor device of claim 1, wherein the semiconductor sheet has a spiral cross-sectional shape along a substantially horizontal plane.

5. The semiconductor device of claim 4, wherein the spiral cross-sectional shape is generally one of circular and polygonal.

6. The semiconductor device of claim 1, wherein the turns of the semiconductor sheet are substantially parallel to each other.

7. The semiconductor device of claim 1, further comprising:
   a silicide compound surrounding the first S/D region and including metal; and
   a S/D contact coupled to the compound.

8. A semiconductor device comprising:
   a first source/drain (S/D) region;
   a second S/D region disposed above the first S/D region; and
   a semiconductor sheet serving as a channel and having bottom and top edges respectively coupled to the first and second S/D regions and a pair of spaced apart lateral edges between the top and bottom edges thereof.

9. The semiconductor device of claim 8, wherein the semiconductor sheet includes a plurality of turns.

10. The semiconductor device of claim 9, wherein the semiconductor sheet has a meandering cross-sectional shape along a substantially horizontal plane.

11. The semiconductor device of claim 10, wherein the meandering cross-sectional shape is generally one of circular and polygonal.

12. The semiconductor device of claim 9, wherein the semiconductor sheet has a spiral cross-sectional shape along a substantially horizontal plane.

13. The semiconductor device of claim 12, wherein the spiral cross-sectional shape is generally one of circular and polygonal.

14. The semiconductor device of claim 9, wherein the turns of the semiconductor sheet are substantially parallel to each other.

15. The semiconductor device of claim 8, further comprising:
- a silicide compound surrounding the first S/D region and including metal; and
- a S/D contact coupled to the compound.

16. A semiconductor device comprising:
- a substrate;
- a first source/drain (S/D) region including a first end portion that is above the substrate and a second end portion that extends from the first end portion thereof;
- a second S/D region above the first S/D region; and
- a semiconductor sheet interconnecting the first and second S/D regions and including a plurality of turns, wherein the first and second end portions of the first S/D region define a horizontal distance between edges thereof of about 30% less than a pitch between the turns of the semiconductor sheet.

17. The semiconductor device of claim 16, further comprising:
- a compound surrounding the first S/D region and including metal; and
- a S/D contact coupled to the compound.

18. The semiconductor device of claim 16, further comprising:
- a compound surrounding the second S/D region and including metal; and
- a S/D contact coupled to the compound.

19. The semiconductor device of claim 16, wherein the length of the semiconductor sheet is greater than about 100 nm.

20. The semiconductor device of claim 16, further comprising a gate stack including a conductive layer and a high-k dielectric layer sandwiched between the semiconductor sheet and the conductive layer.

* * * * *